United States Patent
Liehr

(10) Patent No.: US 6,416,292 B1
(45) Date of Patent: Jul. 9, 2002

(54) METHOD FOR TRANSPORTING AT LEAST ONE VAPOROUS SUBSTANCE THROUGH THE WALL OF A VACUUM CHAMBER AND INTO THE VACUUM CHAMBER AND A DEVICE FOR EXECUTING AND UTILIZING THE METHOD

(75) Inventor: Michael Liehr, Feldatal (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/568,660

(22) Filed: May 10, 2000

(30) Foreign Application Priority Data

May 11, 1999 (DE) .......................................... 199 21 744

(51) Int. Cl.[7] ................................................. F04B 37/02
(52) U.S. Cl. ........................................................ 417/48
(58) Field of Search ............................................ 417/48

(56) References Cited

U.S. PATENT DOCUMENTS 3,405,728 A * 10/1968 Dexter .......................... 137/251
3,614,512 A * 10/1971 Evrard .......................... 313/230
5,256,036 A * 10/1993 Cole ............................. 417/48

* cited by examiner

Primary Examiner—Timothy S. Thorpe
Assistant Examiner—William H Rodriguez
(74) Attorney, Agent, or Firm—Smith, Gambrell & Russell, LLP

(57) ABSTRACT

Method for transporting at least one vaporous substance through the wall (4) of a vacuum chamber and into the vacuum chamber and device for executing and utilizing the method. In the method, a vaporous substance is introduced from the outside through an interior pipe (1) of a double-walled pipe into the vacuum chamber, with electric current from a power supply (3) applied to the interior pipe (1) and exterior pipe (2) of the double-walled pipe.

13 Claims, 2 Drawing Sheets

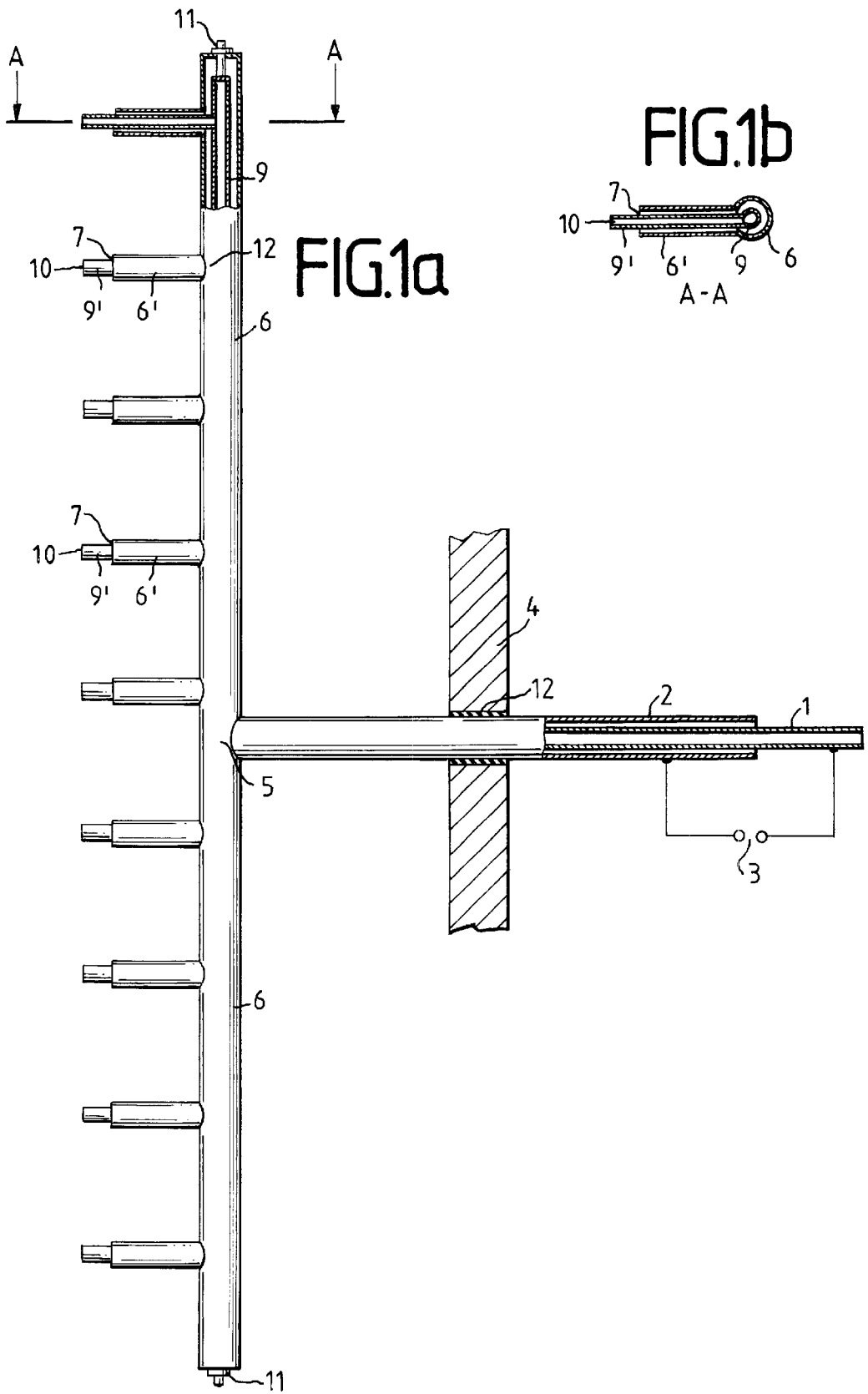

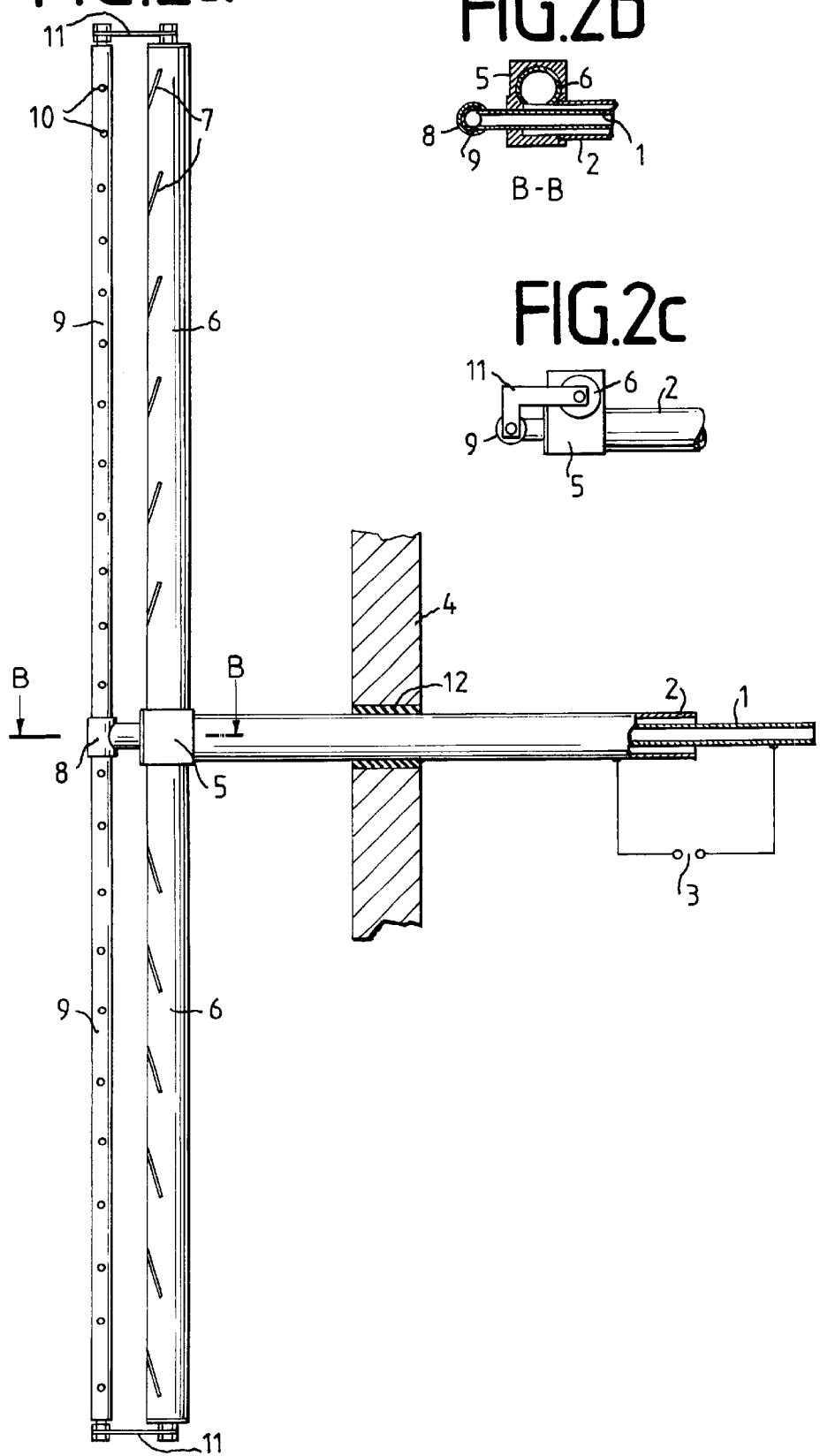

METHOD FOR TRANSPORTING AT LEAST ONE VAPOROUS SUBSTANCE THROUGH THE WALL OF A VACUUM CHAMBER AND INTO THE VACUUM CHAMBER AND A DEVICE FOR EXECUTING AND UTILIZING THE METHOD

INTRODUCTION AND BACKGROUND

The present invention pertains to a method for transporting at lease one vaporous substance through the wall of a vacuum chamber and into the vacuum chamber. In a further aspect, the present invention pertains to a device for executing and utilizing the method.

Consequently, an object of the invention is to create a method for transporting at least one vaporous substance through the wall of a vacuum chamber and into the vacuum chamber, with which there are no shutdowns as a result of leakage.

Another object of the invention is to assure that no condensation of the vaporous substance occurs during transport.

A still further object of the invention is to create a device for achieving the foregoing goals.

SUMMARY OF THE INVENTION

The above and other objects of the present invention can be achieved by means of a method for transporting at least one vaporous substance through the wall of a vacuum chamber and into the vacuum chamber, with which a vaporous substance is introduced from the outside into a vacuum chamber through the interior pipe of a double-walled pipe, with electric current from a power supply sourced to the interior and exterior pipes. A maximum of two vaporous substances can be transported with this method. The interior pipe and the exterior pipe of the double-walled pipe is formed of electrically conductive material. The current may be DC or AC. As a rule, the current magnitude is between 80 A and 300 A. Surprisingly, it has been shown that a disadvantageous condensation of vaporous substances during transport through the wall of a vacuum chamber into the vacuum chamber may be avoided in a particularly advantageous manner if the vaporous substance is conducted through a double-walled pipe with current flowing to the interior and exterior pipes. The disadvantageous arrangement of heating strips may be omitted completely.

Structurally, the exterior pipe may be guided through the wall of a vacuum chamber relatively simply without sealing problems. The interior and exterior pipes are connected to each other in an electrically conductive manner in such a way that current flows through both pipes, the magnitude of which may be adjusted also through the selection of die dimensions of the interior and exterior pipes. Due to the electrical resistance of the interior and exterior pipes, the flow of electric current leads to a heating of the double-walled pipe, with the ability to control or regulate the desired temperature directly by means of the power supply. This is particularly advantageous in that a constant temperature may be set for a pipe of constant diameter. It is also advantageous to heat a pipe branch uniformly such that even in inaccessible locations temperatures may be set above the boiling point of a given vaporous substance.

In a preferred embodiment of die invention, two vaporous substances are introduced at different partial pressures; the vaporous substance at the lower partial pressure is conducted through the interior pipe, and the vaporous substance at the higher partial pressure is conducted through die annular gap between interior and exterior pipes. Because of the smaller diameter of the interior pipe relation to the exterior pipe, a constant current flow will heat the interior pipe to a higher temperature than the exterior pipe, provided that the interior and exterior pipes are fabricated from the same material. Since, in order to avoid condensation of a vaporous substance under a lower partial pressure, it must be heated to a higher temperature than a vaporous substance at a very high partial pressure, it is particularly advantageous to flow the vaporous substance at the lower partial pressure through the interior pipe. Thus, for example, it is relatively simple to introduce separately two substances in vaporous form at different partial pressures into a vacuum chamber.

According to an additional preferred embodiment of the invention, at least one vaporous substance is subjected to at least one change in the flow direction within a vacuum chamber. This occurs advantageously by means of an arrangement of pipe branches that may partially feature baffles for changing the flow direction. A change in the flow direction may occur multiple times since all pipe branches are heated homogeneously with electric current, assuring the avoidance of condensation of the vaporous substance even if transport must take place over long distances with changing flow directions. Therefore, it is possible to bring a vaporous substance to the desired target location easily.

According to an additional embodiment of the invention, two vaporous substances are subjected to at least one change in flow direction with the respective changes in flow direction being equal. This is achieved advantageously by means of a double-walled pipe, where the interior and exterior pipes were of the same longitudinal axis.

In an additional embodiment of the invention, two vaporous substances are subjected to at least one change in flow direction, with the respective changes in flow direction leading to an at least partially separate parallel flow of both vaporous substances. Through an arrangement of several T-shaped branches it is possible to separate the interior pipe from the exterior pipe such that the two vaporous substances may be supplied to different target locations. This in no way disadvantageously influences a uniform heating of the transport system by means of electric current. Thus, it is possible to easily adapt the method of transporting at least one vaporous substance through the wall of a vacuum chamber and into the vacuum chamber to vacuum processes which must proceed in a vacuum chamber.

Moreover the problem of the invention is solved by means of a device including a double-walled pipe with interior and exterior pipes, where the interior and exterior pipes are interconnected by means of a power supply. During operation, the interior and exterior pipes must be interconnected by means of an electrically conductive connection. Structurally, the device is relatively simple to configure and it may be guided though the wall of a vacuum chamber without problem, with the particular advantage of avoiding sealing problems.

According to an additional embodiment of the invention, the end of the exterior pipe opposite the power supply opens into a T-shaped branch. The end of the interior pipe opposite the power supply opens into a second T-shaped branch arranged identically within the T-shaped branch for the exterior pipe. A pipe extension having at least one discharge point is arranged on both ends of the T-shaped branch and with a second pipe extension having at least one additional discharge point arranged in the pipe extension on both sides of the second T-shaped branch for the interior pipe. The pipe extension and the second pipe extension are connected to each other by means of at least one connector so that they have a common longitudinal axis. The respective connector is electrically conductive. Consequently, the device is configured according to the principle of a double-walled pipe over the entire transport distance, with changes in direction being carried out by an arrangement of T-shaped branches. This is a particularly simple way to facilitate installation of the device.

In an additional embodiment of the invention, one or more discharge points and one or more additional discharge points feature in each case a longitudinal axis that is perpendicular to the common longitudinal axis of the pipe extension and the second pipe extension. In this way, a required change in direction may be also carried out by means of T-shaped branches, making for a simple and especially quick execution of a structural configuration.

According to an additional embodiment of the invention, one or more discharge points and one or more additional discharge points have the same longitudinal axis. In this way, the device may be configured according to the principle of a double-walled pipe over virtually the entire transport distance, where it is entirely possible and advantageous to select different pipe diameters.

According to an additional embodiment of the invention, the end of the exterior pipe opposite the power supply opens into a T-shaped branch. The end of the interior pipe opposite the power supply opens into a second T-shaped branch that is arranged adjacent to the T-shaped branch and that is a greater distance from the power supply than die T-shaped branch. A pipe extension having one or more opening is arranged on both ends of the T-shaped branch, and a second pipe extension having one or more additional opening is arranged on both ends of the second T-shaped branch for the interior pipe. The pipe extension and the second pipe extension are connected to each other by means of at least one connector so that the longitudinal axes are parallel. This affords a particular structural advantage when subjecting two vaporous substances to a change in flow direction, were it is possible to adjust a partially separate parallel flow of both vaporous substances. Consequently, a vaporous substance initially flowing in the interior pipe is transported, in some sections, partially adjacent to the vaporous substance which initially was transported between the interior and exterior pipes of a double-walled pipe. Different target locations may be reached without problems in this way. In this connection, a pipe extension is connected to the second pipe extension with a connector that is electrically conductive, enabling current flow. The openings in the pipe extensions may be configured differently according to the application.

According to an additional embodiment of the invention, one or more openings or one or more additional openings are in die form of a slot. This facilitates the arrangement of the openings while simultaneously avoiding a clogging of the openings after relatively brief operating times.

According to an additional embodiment of the invention, the interior pipe, in longitudinal direction, passes through the end of the T-shaped branch opposite the power supply. This simplifies the structural configuration of the device.

According to an additional embodiment of the invention, a circumferential seal is arranged on the outside of the exterior pipe. This circumferential seal is arranged advantageously at the location on the exterior pipe directly bordering the outside of the vacuum chamber wall. This is a particularly simple way to strengthen the seal between the exterior pipe and the vacuum chamber wall, which is especially advantageous if a device for transport to the interior of the vacuum chamber must be located at various positions according to the respective application.

Finally, the object of the invention is the utilization of a device for transporting vaporous substances through the wall of a vacuum chamber and into the vacuum chamber for a vacuum coating process. In a vacuum coating process, any condensation of the vaporous substance in the vacuum chamber must be completely avoided during its introduction into the vacuum chamber. This can be carried out especially advantageously with the device according to the invention.

BRIEF DESCRIPTION OF THE DRAWINGS

In the following, the invention is explained in greater detail and with the use of examples with the aid of the drawing; wherein FIGS. 1a,b respectively show a device for transporting one or more vaporous substances into a vacuum chamber in longitudinal section and a top view along section A—A, and FIGS. 2a,b,c respectively show a modification of the device for transporting one or more vaporous substances into a vacuum chamber in longitudinal section, a top view, and a cross section along section B—B.

DETAILED DESCRIPTION OF INVENTION

FIG. 1a shows, in longitudinal section, a device for transporting at least one vaporous substance through the wall (4) of a vacuum chamber and into the vacuum chamber. It consists of a double-walled pipe having an interior pipe (1) and exterior pipe (2), with the interior pipe (1) and exterior pipe (2) interconnected by means of a power supply (3). At the wall (4) of the vacuum chamber, the exterior pipe (2) features a circumferential seal (12). The end of the exterior pipe (2) opposite the power supply (3) opens into a T-shaped branch (5). The end of the interior pipe (1) opposite the power supply (3) opens into a second T-shaped branch (not represented) that is arranged identically within the T-shaped branch (5) for the exterior pipe (2).

A pipe extension (6) having one or more discharge points (6') is arranged on both sides of the T-shaped branch (5). A second pipe extension (9) having at least one additional discharge point (9') is arranged on both sides of the second T-shaped branch for the interior pipe (1) in the pipe extension (6), with the pipe extension (6) and the second pipe extension (9) connected to each other by means of at least one connector (11) and have a common longitudinal axis. The connector (11) consists of an electrically conductive material.

With this device it is possible, for example, to introduce two vaporous substances at differing partial pressures into a vacuum chamber, where it is advantageous to conduct the vaporous substance at a lower partial pressure through the interior pipe (1). In a double-walled pipe, the vaporous substance at the higher partial pressure advantageously flows between the interior pipe (1) and exterior pipe (2). A partitioning of both gas streams occurs at the T-shaped branch, with both gas streams undergoing a 90° change in flow direction. Additional changes in the flow direction are possible through the arrangement of additional T-parts (12 ['] ). In this way, vaporous substances reach, for example, the discharge point (6') and the additional discharge point (9') and leave the device at the openings (7,10). During operation, current flows, for example, through the interior pipe (1), through the second pipe extension (9), through the connectors (11) and, by means of the pipe extension (6), back to the exterior pipe (2). In the device described, current does not flow through the discharge point (6') and the additional discharge point (9'). However, thermal conduction assures heating of the discharge point (6') and the additional discharge point (9').

FIG. 1b shows a top view along section A—A. The discharge point (6') and the additional discharge point (9') have the same longitudinal axis.

FIG. 2 shows, in schematized and simplified form, an alternative embodiment of a device for transporting one or more vaporous substances through the wall (4) of a vacuum chamber and into the vacuum chamber, in longitudinal section (FIG. 2a) together with cross section B—B (FIG. 2b) and also a top view (FIG. 2c). In contrast to the configuration of the an device shown in FIG. 1, the end of the interior pipe (1) opposite the power supply (3) opens into a second T-shaped branch (8), that is arranged adjacent to the T-shaped branch (5). The second T-shaped branch (8) is a greater distance from the power supply (3) than the T-shaped branch (5). The pipe extension (6) and the second pipe extension (9) are connected to each other by means of a connector (11) and have parallel longitudinal axes. The openings (7) are in the form of slots in comparison to the additional openings (10), avoiding a rapid clogging of the openings (7). The interior pipe (1), in the longitudinal direction, passes through the side of the T-shaped branch (5) opposite the power supply (3). The arrangement of this device works to particular advantage when provided in order to conduct two dissimilar vaporous substances to different target locations within the vacuum chamber.

Further variations and modifications of the foregoing will be apparent to those skilled in the art and are intended to be encompassed by the claims appended hereto.

German priority application 199 21 744.0 is relied on and incorporated herein by reference.

What is claimed is:

1. A method of transporting at least one vaporous substance through a wall of a vacuum chamber and into a vacuum chamber, said method comprising the steps of:
   introducing the vaporous substance from outside into a vacuum chamber through an interior pipe of a double-walled pipe;
   heating said interior pipe with a current from a power supply applied to said interior pipe and an exterior pipe of said double-walled pipe to prevent condensation of the vaporous substance traveling within said interior pipe; and
   providing an arrangement of T-shaped branches within said vacuum chambers for varying flow direction of said vaporous substance.

2. A method of transporting at least one vaporous substance through a wall of a vacuum chamber and into a vacuum chamber, said method comprising the steps of:
   introducing a first vaporous substance at a lower partial pressure from outside into a vacuum chamber through an interior pipe of a double-walled pipe;
   introducing a second vaporous substance at a higher partial pressure from outside into said vacuum chamber through an annular gap between the interior pipe and an exterior pipe of said double-walled pipe;
   heating said interior and exterior pipes with a current from a power supply applied to said interior and said exterior pipes to prevent condensation of said vaporous substances traveling within said double-walled pipe; and
   providing an arrangement of T-shaped branches within said vacuum chamber for varying flow direction of at least one of said first and second vaporous substances.

3. The method of claim 2, wherein at least one vaporous substance is subjected to at least one change in flow direction within said vacuum chamber.

4. The method of claim 3, where two vaporous substances are subjected to at least one change in the flow direction, where the changes in the flow direction are equal in each case.

5. The method of claim 3, wherein two vaporous substances are subjected to at least one change in flow direction, where the changes in flow direction lead to an at least partially separate and parallel flow of both vaporous substances.

6. A device for transporting at least one vaporous substance through a wall of a vacuum chamber and into a vacuum chamber comprising a double-walled pipe having an interior pipe and exterior pipe, where the interior pipe and exterior pipe each have ends and are connected to each other by means of a power supply at one of their respective ends, and include an arrangement of T-shaped branches at their other respective ends.

7. The device of claim 6, where the end of the exterior pipe opposite the power supply opens into a T-shaped branch and the end of the interior pipe opposite the power supply opens into a second T-shaped branch arranged identically within the T-shaped branch for the exterior pipe and for which a pipe extension having at least one discharge point is arranged on both sides of the T-shaped branch and for which a second pipe extension having at least one additional discharge point is arranged on both sides of the second T-shaped branch for the interior pipe in the pipe extension, where the pipe extension and the second pipe extension are connected to each other by means of at least one connector and have a common longitudinal axis.

8. The device of claim 7, wherein one or more discharge points and one or more additional discharge points respectively, feature a longitudinal axis perpendicular to the common longitudinal axis of the pipe extension and the second pipe extension.

9. The device of claim 8, wherein at least one discharge point and at least one additional discharge point have the same longitudinal axis.

10. The device of claim 6, wherein the end of the exterior pipe opposite the power supply opens into a T-shaped branch and the end of the interior pipe opposite the power supply opens into a second T-shaped branch arranged adjacent to the T-shaped branch and have a greater distance from the power supply than the T-shaped branch and for which a pipe extension having at least one opening is arranged on both sides of the T-shaped branch and for which a second pipe extension having at least one additional opening is arranged on both sides of the second T-shaped branch for the interior pipe, where the pipe extension and the second pipe extension are connected to each other by means of at least one connector and have parallel longitudinal axes.

11. The device of claim 10, wherein one or more openings or one or more are in the form of slots.

12. The device of claim 10 wherein the interior pipe, in the longitudinal direction, passes through the side of the T-shaped branch opposite the power supply the exterior pipe.

13. The device of claim 7, wherein a circumferential seal is arranged on the outside of the exterior pipe.

* * * * *

UNITED STATES PATENT AND TRADEMARK OFFICE
CERTIFICATE OF CORRECTION

PATENT NO.    : 6,416,292 B1
DATED         : September 20, 2002
INVENTOR(S)   : Michael Liehr It is certified that error appears in the above-identified patent and that said Letters Patent is hereby corrected as shown below:

Column 1,
After line 14, add:
-- Methods for transporting a vaporous substance from the outside into a vacuum chamber are known. For the method utilized in practice, it is necessary to heat the parts of the device as uniformly as possible in order to avoid condensation of the vaporous substances in the interior of the transport system. In order to avoid this disadvantageous condensation, it is generally common to wrap the transport system with heating strips or heating conductor jacket thus, to bring it to the desired temperature. However, an arrangement of said heating strips or heating conductor jacket in a vacuum system is generally problematic. Parts of the transport system must be guided through the wall of a vacuum chamber, causing sealing problems if the parts are wrapped with heating strips. In addition, uniformly arranging heating strips on individual parts of the transport system, especially angular parts, is problematic and makes the a uniform heating of all parts of the transport system possible only at very high structural cost, if at all. --

Column 3,
Line 54, change "die" to -- the --
Line 52, should read
-- According to an additional embodiment of the invention, one or more openings or one or more additional openings are in the form of a slot. This facilitates the arrangement of the openings while simultaneously avoiding a clogging of the openings after relatively brief operating times. --

UNITED STATES PATENT AND TRADEMARK OFFICE
CERTIFICATE OF CORRECTION

PATENT NO.   : 6,416,292 B1
DATED        : September 20, 2002
INVENTOR(S)  : Michael Liehr It is certified that error appears in the above-identified patent and that said Letters Patent is hereby corrected as shown below:

<u>Column 6,</u>
Line 45, should read:
-- 11. The device of claim 10, wherein one or more openings are in the form of slots.
  12. The device of claim 10 wherein the interior pipe, in the longitudinal direction, passes through the side of the T-shaped branch opposite the power supply. --
Line 59, delete "or one"
Lines 62-63, delete "the exterior pipe"

Signed and Sealed this

Third Day of December, 2002

JAMES E. ROGAN
*Director of the United States Patent and Trademark Office*